United States Patent [19]
Hsu

[11] Patent Number: 5,547,903
[45] Date of Patent: Aug. 20, 1996

[54] METHOD OF ELIMINATION OF JUNCTION PUNCHTHROUGH LEAKAGE VIA BURIED SIDEWALL ISOLATION

[75] Inventor: Chen-Chung Hsu, Taichung, Taiwan

[73] Assignee: United Microelectronics Corporation, Hsin-Chu, Taiwan

[21] Appl. No.: 344,003

[22] Filed: Nov. 23, 1994

[51] Int. Cl.[6] .................... H01L 21/44; H01L 21/48
[52] U.S. Cl. ................ 437/203; 437/29; 437/40; 437/913; 437/38
[58] Field of Search .................. 437/41, 38, 44, 437/913, 29, 203, 40, 40 DM; 257/330–334, 374; 148/DIG. 53

[56] References Cited

U.S. PATENT DOCUMENTS

| | | | |
|---|---|---|---|
| 4,983,535 | 1/1991 | Blanchard | 437/203 |
| 5,108,937 | 4/1992 | Tsai et al. | 437/40 |
| 5,270,257 | 12/1993 | Shin | 437/41 |
| 5,380,670 | 1/1995 | Hagino | 437/203 |

*Primary Examiner*—H. Jey Tsai
*Attorney, Agent, or Firm*—William H. Wright

[57] ABSTRACT

A method for forming MOSFET devices, with reduced exposure to source and drain leakage currents due to punchthrough phenomena, has been developed. The structure is fabricated using a buried insulator sidewall to isolate the source and drain regions. This in turn is accomplished by creating a trench in the substrate, between the source and drain regions, and forming an insulator sidewall on the sides of the trench. A selective epitaxial process is used to refill the trench and a gate oxide is grown from the epitaxial silicon. Conventional processing completes this buried insulator MOSFET structure.

22 Claims, 3 Drawing Sheets

METHOD OF ELIMINATION OF JUNCTION PUNCHTHROUGH LEAKAGE VIA BURIED SIDEWALL ISOLATION

FIELD OF THE INVENTION

The present invention relates to a process in which Metal Oxide Semiconductor Field Effect Transistor, (MOSFET): devices can be fabricated using a sidewall isolation technique that reduces the risk of junction punchthrough.

DESCRIPTION OF PRIOR ART

Very large scale integration, (VLSI), has allowed the semiconductor chip industry to increase circuit density while still reducing cost. This has been accomplished primarily via advances in photolithographic disciplines. The development of more sophisticated cameras as well as more sensitive photoresist materials have allowed the semiconductor engineering community to routinely achieve sub-micrometer dimensions. Advances in reactive ion etching, (RIE): as well as similar advances in chemical vapor deposition, (CVD), and ion implantation, (I/I), have also led the way to chip microminiturazation.

However with the trend to smaller devices specific yield detractors and reliability mechanisms become more prevalent. For example as the gate oxide of a MOSFET device decreases in thickness, the possibility of premature gate oxide breakdown or shorts, increase. Also as channel lengths decrease, in an attempt to improve device performance, the risk of a hot electron reliability mechanism increases. In addition narrower channel lengths give rise to a greater possibility of junction punchthrough. This occurs when the depletion region formed by the source of the device, and the underlying substrate, touches or comes close to the depletion region formed by the drain of the device and the underlying substrate. Various methods have been developed that minimize this punchthrough effect. Increasing the doping level of the source and drain, or increasing the doping level of the substrate or underlying silicon have resulted in significant reductions of the punchthrough effect. However increasing the source and drain doping levels greatly increase the risk of hot electron generation. Therefore a structure will now be disclosed in which the reduction or elimination of punchthrough is accomplished via use of a novel structure, The structure used to reduce the punchthrough effect is accomplished using a sidewall insulator as a barrier to punchthrough. Prior art, U.S. Pat. No. 5,108,937 shows the formation of a gate oxide/electrode sunken device to help the anti-punchthrough characteristics of MOSFETS, however this present invention teaches a different and effective method to relieve the effects of punchthrough.

SUMMARY OF THE INVENTION

It is an object of this invention to provide a method of manufacturing a semiconductor device that will not be sensitive to source and drain leakage currents that result from depletion regions, created by the source and drain areas and the underlying substrate, touching or coming in close proximity to each other.

It is another object of this invention to create a trench in the silicon substrate between the source and drain regions.

It is still another object of this invention to create an insulator sidewall on the sides of the trench.

It is yet another object of this invention to fill the trench with single crystalline silicon via the use of a selective silicon deposition process, and use this silicon for the channel region of the FET.

In accordance with this present invention a method is described for fabricating MOSFET devices in which, after a blanket arsenic ion implantation and silicon nitride deposition, a trench is etched through the silicon nitride and arsenic layer, and into the silicon substrate. A heavily doped P type region is created at the bottom of the trench via ion implantation, and a insulator spacer is created on the sidewalls of the trench, via CVD and RIE processing. Selective silicon deposition techniques are used to fill the trench, and then doped to a specific P-type concentration, via ion implantation, to create the desired channel region. A gate oxidation, polysilicon deposition and patterning create a gate oxide/electrode structure. This FET device, due to the buried sidewall insulator, adjacent to the source and drain regions, is not susceptible to junction punchthrough.

BRIEF DESCRIPTION OF THE DRAWINGS

The object and other advantages of this invention are best explained in the preferred embodiment with reference to the attached drawing that include.

DESCRIPTION OF THE PREFERRED EMBODIMENTS

The method of forming MOSFETs using a buried sidewall insulator and refilled channel region, needed to avoid deleterious junction punchthrough effects, will now be covered in detail. This structure can be used as a part of a MOSFET device that is now being manufactured in industry, therefore only the specific areas unique to understanding this invention will be described in detail.

Figure 1:
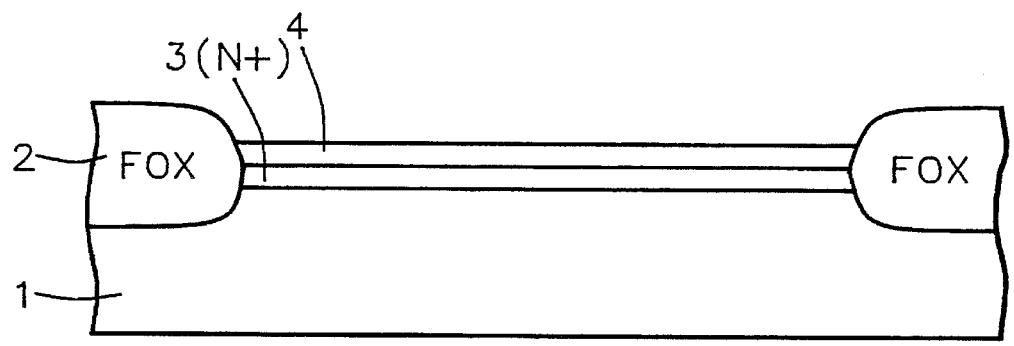
FIG. 1–8, which schematically illustrate the stages of fabrication of a MOSFET device with the buried sidewall insulator, and refilled channel region.

Referring now to FIG. 1, a substrate, 1, composed of P type single crystal silicon with a <100> orientation is used. Thick field oxide regions, 2, (FOX), used for device isolation purposes, are formed surrounding the region where the device is to be built. Briefly the method commonly practiced in the industry is to use a thin silicon dioxide underlying layer, and an overlying silicon nitride layer, which will subsequently serve as the oxidation mask during the FOX growth. Using conventional photolithographic and RIE processing the desired device area remains masked by the silicon nitride/silicon dioxide layers while the remaining portions of the exposed silicon is subjected to an oxidation in steam at a temperature between about 800° to 950° C., to achieve a FOX thickness of about 3000 to 6000 Angstroms.

After removal of the silicon nitride layer, via a heated solution of hot phosphoric acid, an arsenic I/I is performed at an energy between about 50 to 80 Kev., and at a dose of between about 4E15 to 6E15 atoms/cm2 to form a doped layer to create source and drain regions. This is shown as layer 3, in FIG. 1. After removal of the silicon dioxide layer, previously used for the FOX fabrication, and then serving as a screen oxide for the arsenic I/I, a layer of silicon nitride is deposited using low pressure chemical vapor deposition, (LPCVD). The silicon nitride layer, 4, is grown at a temperature of between about 700° to 800° C., to a thickness of about 2000 to 4000 Angstroms.

Figure 2:
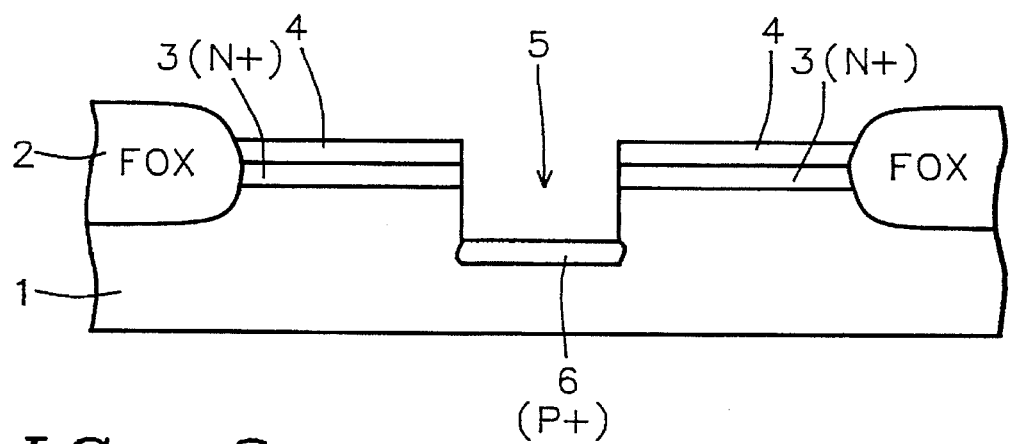

Using conventional photolithographic processing the desired channel region is defined in photoresist. The photoresist image is transferred to the underlying silicon nitride via RIE anisotropical processing, followed by another RIE process used to anisotropically etch a trench in the substrate silicon. The depth of the etching is the entire arsenic I/I region, 3, and approximately 2000 to 5000 Angstroms into the P type substrate. The trench, 5, is schematically shown in FIG. 2. An I/I is next performed using BF2 at an energy of between about 50 to 70 Kev., and at a dose of between about 1E15 to 3E15 atoms/cm2 to form a channel stop region. This is shown as region 6, in FIG. 2.

Figure 3:
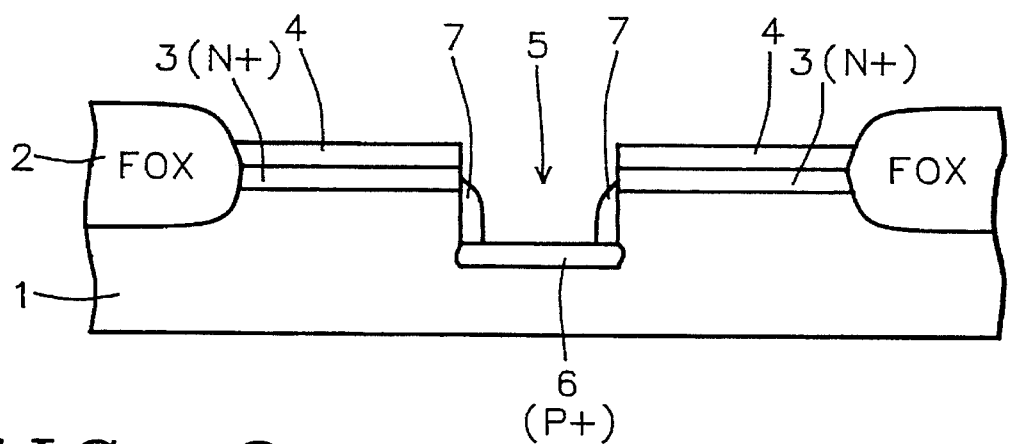

A sidewall insulator spacer is now formed and shown as layer 7, in FIG. 3. This is accomplished by thermal oxidation, at a temperature between about 800° to 950° C., to a thickness of about 500 to 1000 Angstroms of insulator layer of silicon dioxide. An anisotropic RIE process is used to remove silicon dioxide from all horizontal surfaces, resulting in the sidewall insulator spacer, 7. The RIE processing is critical since the desired height of the sidewall insulator, 7, is to interface the sides of the exposed P type trench, and also to interface approximately half the depth of the N+ region, 3. If a longer RIE procedure is used the sidewall insulator may fall below the N+ region, while a shorter RIE cycle can result in the undesirable complete sidewall insulation of the N+ region.

Figure 4:
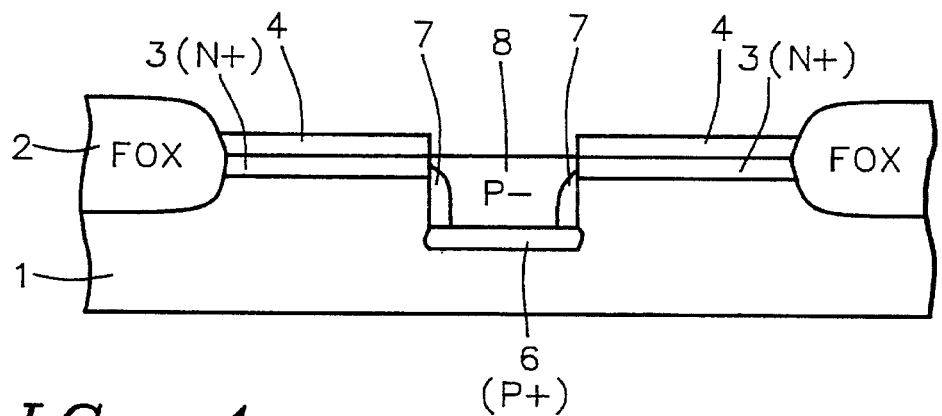

A selective epitaxial process is used to fill the trench, 5. This is accomplished using SiH2Cl2+HCl+H2, at a temperature of between about 900° to 1000° C., and at a pressure of about 40 to 50 Torr. The thickness of single crystalline silicon used, about 2000 to 5000 Angstroms, is chosen so that the surface of the refilled channel region is at the interface of the silicon nitride, 4, and the N+ region, 3, shown schematically in FIG. 4. An I/I, using B11 at an energy of 100 to 150 Kev., and at a dose of between about 1E12 to 1E13 atoms/cm2, is used to create the P-well region, 8.

Figure 5:
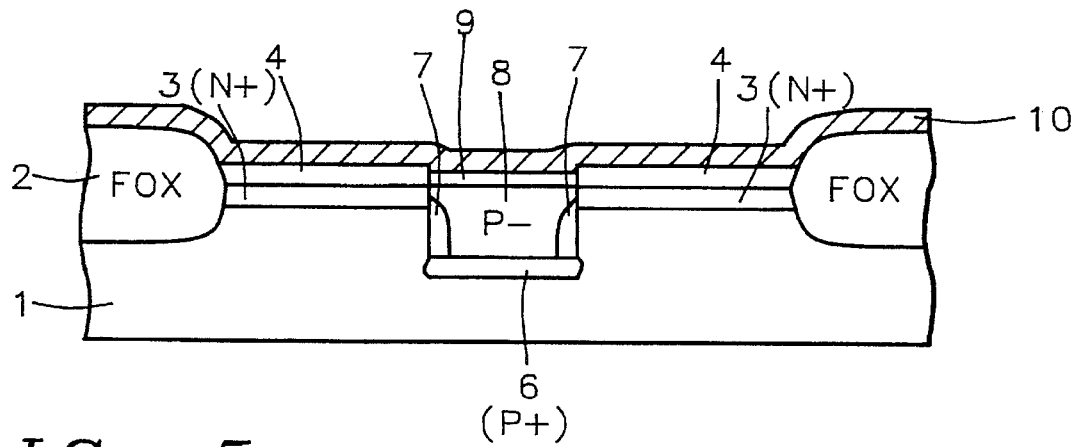
Figure 6:
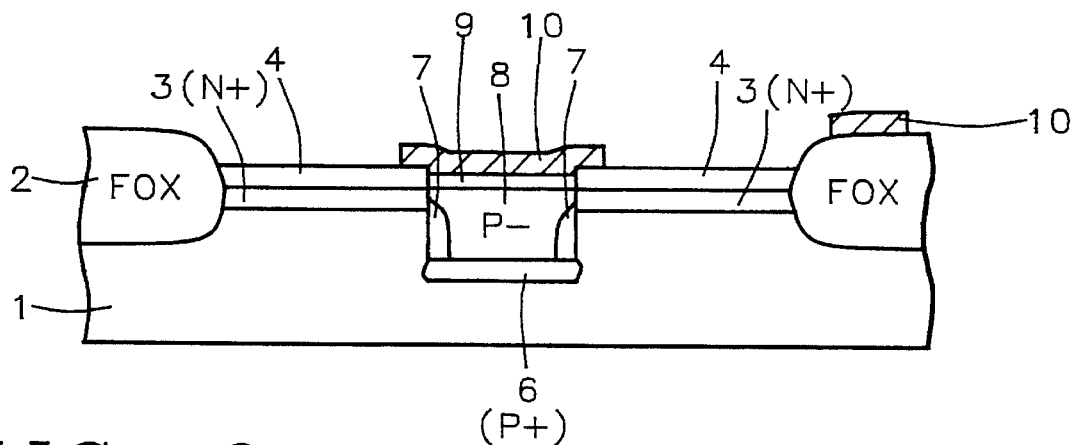

Next after a series of organic and inorganic wet cleans, a carefully grown gate oxide to a thickness of about 80 to 250 Angstroms, 9, is formed on the surface of the refilled channel region, 8, followed by the deposition of polycrystalline silicon, 10, using SiH4 at a temperature between about 550° to 700° C., to a thickness of about 4000 to 6000 Angstroms. These layers are shown schematically in FIG. 5. The polycrystalline silicon is then doped using arsenic I/I at an energy of between about 50 to 80 Kev., and at a dose of between 1E15 to 1E16 atoms/cm2. The polycrystalline silicon, which will serve as the gate electrode in this MOSFET device, is now defined using standard photolithographic procedures, followed by RIE, illustrated schematically in FIG. 6. A chemical—mechanical polishing process can also be employed to define the polysilicon gate structure.

Figure 7:
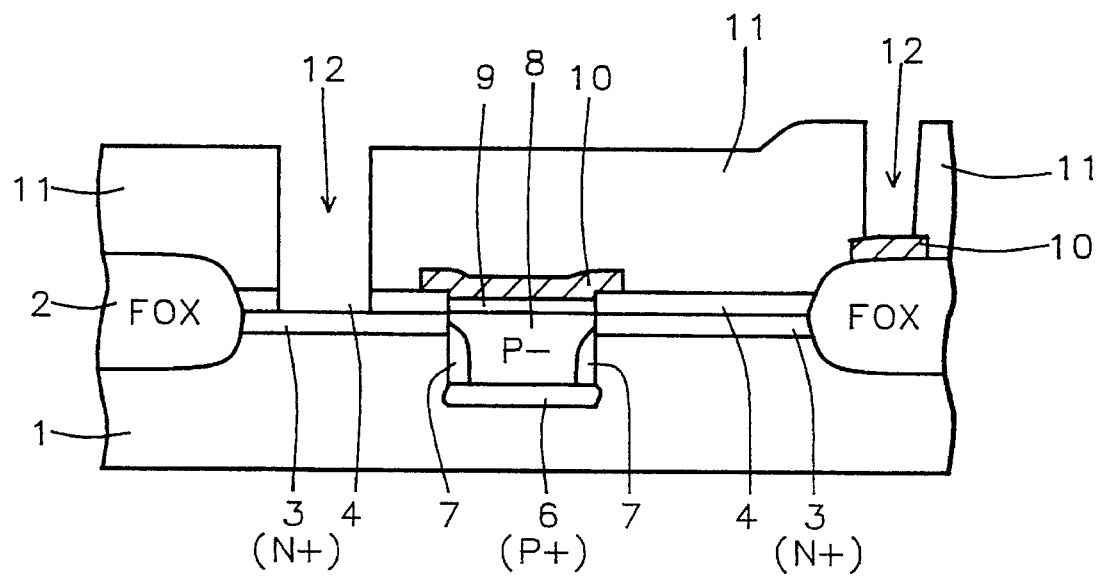
Figure 8:
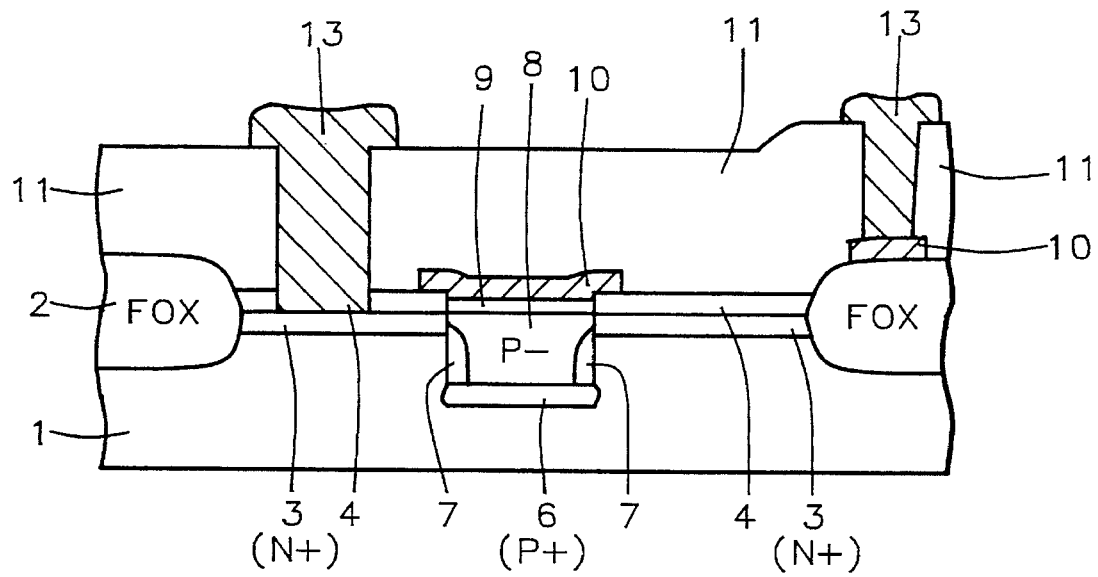

A silicon dioxide film, 11, is deposited using atmospheric pressure chemical vapor deposition, (APCVD), processing, at a temperature between about 800° to 950° C., to a thickness of about 1500 to 3000 Angstroms. Photolithographic and RIE processing is then performed to open contact holes, 12, to the N+ regions, 3, which now serve as the source and drain regions of the MOSFET. This is shown in FIG. 7. Contact metallurgy is then deposited and again using standard photolithographic and RIE proceesing, the metal contacts, 13, shown schematically in FIG. 8, are formed.

The process used to create the buried sidewall insulator, can be applied to N type or P type, (NFET, PFET), devices, as well as to complimentary, (CMOS), structures. In addition BiCMOS, (bipolar- CMOS), devices can also be fabricated using this invention.

While this invention has been particularly shown and described with reference to the preferred embodiments thereof, it will be understood by those skilled in the art that various changes in form and details may be made without departing from the spirit and scope of this invention.

What is claimed is:

1. A method for fabricating a MOSFET device on a semiconductor substrate comprising the steps of:

forming a field oxide pattern, for isolation of device regions, on a surface of said substrate;

ion implantating a first conductivity imparting dopant of first conductivity type into said device regions to form a doped layer to create source and drain regions;

depositing a silicon nitride layer on said field oxide pattern, and on said doped layer;

removing portion of said silicon nitride layer to form an opening to expose a position of said doped layer;

removing the portion of exposed said doped layer and said substrate, from said silicon nitride opening, to form a channel trench region;

ion implanting a second conductivity imparting dopant of second conductivity type into a bottom surface of said channel trench region;

growing an insulator layer in said channel trench region and on said silicon nitride layer;

anisotropic etching to form insulator sidewalls on sides of said channel trench region;

growing an epitaxial layer of silicon in said channel trench region;

ion implanting a third conductivity imparting dopant of second conductivity type into said epitaxial silicon layer;

growing a gate oxide on an upper surface of said epitaxial silicon;

depositing a polysilicon layer on said gate oxide and on said silicon nitride layer;

ion implanting a fourth conductivity imparting dopant of first conductivity type into said polysilicon layer;

patterning said polysilicon layer to form said polysilicon gate structures on said gate oxide and on said silicon nitride;

depositing a first dielectric layer on said polysilicon structures and on said silicon nitride;

patterning said first dielectric layer and said silicon nitride layer to form openings to said polysilicon structures and to said source and drain regions;

depositing a metal film on said first dielectric layer, and in said openings to said polysilicon structures and to openings to said source and drain regions; and patterning of said metal film to form contacts to said polysilicon structures and to said source and drain regions.

2. The method of claim 1, wherein said first conductivity imparting dopant, used to form said doped layer to create source and drain regions, is arsenic, ion implanted at an energy between about 50 to 80 Kev., at a dose of between about 4E15 to 6E15 atoms/cm2.

3. The method of claim 1, wherein said channel trench region is formed by anisotropic etching of silicon nitride, and anisotropic etching of said doped layer, and said substrate.

4. The method of claim 1, wherein said second conductivity imparting dopant is BF2, ion implanted at an energy between about 50 to 70 Kev., at a dose between about 1E15 to 3E15 atoms/cm2.

5. The method of claim 1, wherein said insulator layer is silicon dioxide, thermally grown at a temperature of between 800° to 950° C., to a thickness of about 500 to 2000 Angstroms.

6. The method of claim 1, wherein said insulator sidewalls are formed by anisotropic reactive ion etching.

7. The method of claim 1, wherein the said channel trench region is filled by deposition of epitaxial selective silicon using SiH2Cl2+HCl+H2, at a temperature between about 900° to 1000° C., to a thickness of about 2000 to 5000 Angstroms.

8. The method of claim 1, wherein said third conductivity imparting dopant is B11, ion implanted at an energy between about 100 to 150 Kev., at a dose between about 1E12 to 1E13 atoms/cm2.

9. The method of claim 1, wherein said gate oxide is grown to a thickness of about 80 to 250 Angstroms.

10. The method of claim 1, wherein said polysilicon layer is deposited at a temperature between about 550° to 700° C., to a thickness of about 4000 to 6000 Angstroms.

11. The method of claim 1, wherein said fourth conductivity imparting dopant is As, ion implanted at a energy between about 50 to 80 Kev., at a dose between 1E15 to 1E16 atoms/cm2.

12. A method for forming an improved MOSFET device on a semiconductor substrate, incorporating a buried sidewall insulator, to reduce source and drain punchthrough leakage, comprising the steps of:

forming a field oxide pattern, for isolation of device regions, on a surface of said substrate;

ion implanting a first conductivity imparting dopant of first conductivity type into said device regions to form a doped layer to create source and drain regions;

depositing a silicon nitride layer on said field oxide pattern, and on said doped layer;

removing a portion of said silicon nitride layer to form an opening to expose a portion of said doped layer;

removing the portion of said exposed doped layer, and said substrate, from said silicon nitride opening to form a channel trench region;

ion implanting a second conductivity imparting dopant of second conductivity type into a bottom surface of said channel trench region, having a concentration higher than a concentration of said substrate, to form a channel stop region;

growing an insulator layer in said channel trench region and on said silicon nitride layer;

anisotropic etching of said insulator layer to form insulator sidewalls on sides of said channel trench region, extending upwards from bottom of said channel trench region, to midpoint of said source and drain region;

selectively growing an epitaxial layer of single crystalline silicon in said channel trench region;

ion implanting a third conductivity imparting dopant of second conductivity type into said epitaxial silicon layer to adjust channel doping level;

growing a gate oxide on an upper surface of said epitaxial silicon layer;

depositing a layer of polysilicon on said gate oxide and on said silicon nitride layer;

ion implanting a fourth conductivity imparting dopant of first conductivity type into said polysilicon layer;

patterning said polysilicon layer to form polysilicon gate structures on said gate oxide and on said silicon nitride;

depositing a first dielectric layer on said polysilicon structures and on said silicon nitride;

patterning said first dielectric layer and said silicon nitride layer, to form openings to said polysilicon structures and to said source and drain regions;

depositing a metal layer on said first dielectric layer, and in said openings to said polysilicon structures and said source and drain regions; and patterning said metal layer to form contacts to said polysilicon structures and to said source and drain regions.

13. The method of claim 12, wherein said first conductivity imparting dopant, used to form said doped layer to create source and drain regions, is arsenic, ion implanted at an energy between about 50 to 80 Kev., at a dose between about 4E15 to 6E15 atoms/cm2.

14. The method of claim 12, wherein said channel trench region is formed by first anisotropic etching of said silicon nitride using RIE processing, and then anisotropic RIE of said doped layer, and said substrate to a depth between about 2000 to 5000 Angstroms below said source and drain regions.

15. The method of claim 12, wherein said second conductivity imparting dopant, is BF2, ion implanted at an energy between about 50 to 70 Kev., at a dose between about 1E15 to 3E15 atoms/cm2.

16. The method of claim 12, wherein said insulator layer is silicon dioxide, thermally grown at a temperature between about 800° to 950° C., to a thickness of about 500 to 2000 Angstroms.

17. The method of claim 12, wherein said insulator sidewalls are formed by anisotropic reactive ion etching and extending from bottom of said trench to a level between about 500 to 1000 Angstroms above said source and drain regions and said substrate interface, or extending to a level where approximately half the depth of said source and drain region is covered by said insulator sidewall.

18. The method of claim 12, wherein said channel trench region is filled by selective epitaxial silicon deposition, using SiH2Cl2+HCl+H2 at a temperature between about 900° to 1000° C., to a thickness of about 500 to 2000 Angstroms.

19. The method of claim 12, wherein said third conductivity imparting dopant is B11, ion implanted at an energy between about 100 to 150 Kev., at a dose between about 1E18 to 1E13 atoms/cm2.

20. The method of claim 12, wherein said gate oxide is grown to a thickness of about 80 to 200 Angstroms.

21. The method of claim 12, wherein said polysilicon layer is deposited at a temperature between about 550° to 700° C. to a thickness of about 4000 to 6000 Angstroms.

22. The method of claim 12, wherein said fourth conductivity imparting dopant is As, ion implanted at an energy between about 50 to 80 Kev., at a dose of between about 1E15 to 1E16 atoms/cm2.

\* \* \* \* \*